(12) United States Patent
Oshima

(10) Patent No.: US 8,692,590 B2
(45) Date of Patent: Apr. 8, 2014

(54) CAPACITIVE LOAD DRIVE CIRCUIT, LIQUID INJECTOR, AND MEDICAL DEVICE

(75) Inventor: Atsushi Oshima, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 315 days.

(21) Appl. No.: 13/295,876

(22) Filed: Nov. 14, 2011

(65) Prior Publication Data

US 2012/0119797 A1   May 17, 2012

(30) Foreign Application Priority Data

Nov. 15, 2010   (JP) ................................. 2010-254581

(51) Int. Cl.
*H03K 3/00*   (2006.01)

(52) U.S. Cl.
USPC ........................................................ 327/112

(58) Field of Classification Search
None
See application file for complete search history.

(56) References Cited

U.S. PATENT DOCUMENTS

| | | | |
|---|---|---|---|
| 7,244,007 B2 | 7/2007 | Ishizaki | |
| 7,259,603 B2 * | 8/2007 | Gibson et al. | 327/170 |
| 7,571,989 B2 | 8/2009 | Ishizaki | |
| 7,746,127 B2 * | 6/2010 | Miyazaki et al. | 327/112 |
| 7,746,935 B2 * | 6/2010 | Bonfiglio | 375/242 |
| 7,798,591 B2 | 9/2010 | Ishizaki | |
| 7,893,676 B2 * | 2/2011 | Hanna | 323/284 |
| 2009/0140780 A1 * | 6/2009 | Miyazaki et al. | 327/112 |
| 2010/0045714 A1 | 2/2010 | Ishizaki | |
| 2011/0109674 A1 | 5/2011 | Oshima | |
| 2011/0234702 A1 * | 9/2011 | Oshima et al. | 347/54 |
| 2011/0242172 A1 | 10/2011 | Yoshino | |
| 2011/0254887 A1 * | 10/2011 | Ide et al. | 347/10 |
| 2012/0119797 A1 * | 5/2012 | Oshima | 327/111 |
| 2012/0313682 A1 * | 12/2012 | Sprentall et al. | 327/172 |
| 2013/0049657 A1 * | 2/2013 | Rozman et al. | 318/400.3 |

FOREIGN PATENT DOCUMENTS

| | | | |
|---|---|---|---|
| JP | 2005-329710 A | 12/2005 |
| JP | 2007-190708 A | 8/2007 |
| JP | 2009-131990 A | 6/2009 |
| JP | 2009-153272 A | 7/2009 |
| JP | 2010-046989 A | 3/2010 |
| JP | 2011-088294 A | 5/2011 |
| JP | 2011-101972 A | 5/2011 |
| JP | 2011-201218 A | 10/2011 |
| JP | 2011-207069 A | 10/2011 |

* cited by examiner

*Primary Examiner* — Lincoln Donovan
*Assistant Examiner* — Khareem E Almo
(74) *Attorney, Agent, or Firm* — Maschoff Brennan

(57) ABSTRACT

A drive waveform signal is pulse-modulated and a modulated signal is generated, the obtained modulated signal is power-amplified, and then, a drive signal is demodulated using a low pass filter. Thus obtained drive signal is negatively fed back, and thereby, the resonance peak of the low pass filter is suppressed. In this regard, by bringing gain in a wider frequency domain to take a fixed value or more, a drive signal having a voltage exceeding a power supply voltage may be stably generated.

5 Claims, 8 Drawing Sheets

$$F(s) = \frac{1}{s^2 \cdot L \cdot Cp + 1}$$

$$\beta(s) = \frac{1}{1 + \dfrac{1}{s \cdot Ch \cdot Rh}}$$

$$H(s) = \frac{1}{\dfrac{1}{G \cdot F(s)} + \beta(s)}$$

CAPACITIVE LOAD DRIVE CIRCUIT, LIQUID INJECTOR, AND MEDICAL DEVICE

BACKGROUND

1. Technical Field

The present invention relates to a technology of driving a capacitive load having a fluctuating capacitive component and a technology of switching and driving plural capacitive loads having different capacitive components.

2. Related Art

There are lots of actuators that perform operations of injecting liquids when predetermined drive signals are applied thereto like injection heads mounted on inkjet printers. Since the operation of the actuator depends on a voltage applied thereto, in order to sufficiently get the performance of the actuator, it is desirable that a higher voltage may be applied. For the purpose, a drive waveform signal to be applied to the actuator is power-amplified and applied to the actuator.

As a method of power-amplifying the drive waveform signal, for example, a method using a class D amplifier is known (JP-A-2005-329710 or the like). In this method, power amplification is performed after the drive waveform signal is pulse-modulated and converted into a pulsed modulated signal. As a pulse modulation system, either of the pulse width modulation (MCOM) system or the pulse density modulation (PDM) system may be applied and the pulse width modulation is typically used. By power-amplifying the obtained pulsed modulated signal, the signal is converted into a pulsed modulated signal (amplified digital signal) that changes between the power supply voltage and the ground, and then, by removing the modulated component using a low pass filter, a power-amplified drive waveform signal (drive signal) is generated.

A class E amplifier used for power amplification in the radio-frequency range (RF) is also known. In the class E amplifier, power amplification is performed utilizing a resonance phenomenon occurring between inductance of an inductive element and capacitance of a capacitive load, and thus, a voltage exceeding the power supply voltage may be generated.

However, in the above described related art, there has been a problem that it is impossible to generate a drive signal by amplifying a drive waveform signal to a voltage equal to or more than the power supply voltage or stably generate the drive signal without being affected by the ambient temperature, the element temperature, and manufacturing variations. For example, in the class D amplifier, the voltage is changed by changing the duty ratio of the pulsed modulated signal, and the voltage may be changed only between the duty ratio of 0% corresponding to the ground and the duty ratio of 100% corresponding to the power supply voltage. In addition, to realize the duty ratio of 100% by pulse width modulation, a pulse having an infinitely narrow width is necessary, however, the pulse width that can be output has a limitation and, actually, it is impossible to amplify the voltage to the power supply voltage. Further, in the case of pulse density modulation, the voltage can be amplified to the power supply voltage, however, apart at a low generation frequency of pulse appears and the pulse component may not sufficiently be removed by a low pass filter in this part, and thus, the obtained drive signal is distorted.

Furthermore, in the class E amplifier, the power amplification is performed utilizing a resonance phenomenon (LC resonance) occurring between inductance L of an inductive element and capacitance C of a capacitive load, however, the frequency at which resonance is generated (resonance frequency) changes due to influences of the ambient temperature, the element temperature change, or manufacturing variations of the elements. Since the LC resonance has a high Q-value, when the resonance frequency changes, gain largely changes. Accordingly, it is impossible to generate a drive signal by stably power-amplifying a drive waveform signal.

SUMMARY

An advantage of some aspects of the invention is to provide a technology that can generate a drive signal having a voltage exceeding a power supply voltage and generate a stable drive signal without being affected by the ambient temperature and manufacturing variations of parts.

A capacitive load drive circuit according an aspect of the invention employs the following configuration. That is, a capacitive load drive circuit that drives a capacitive load by applying a predetermined drive signal to the capacitive load, includes a drive waveform signal output circuit that outputs a drive waveform signal as a reference for the drive signal, an arithmetic circuit that generates an error signal by computing a difference between the drive waveform signal and a feedback signal generated from the drive signal applied to the capacitive load, a modulator that generates a modulated signal by pulse modulation of the error signal, a digital power amplifier that generates a pulsed amplified digital signal by power amplification of the modified signal, an inductive element that connects the digital power amplifier and the capacitive load and supplies the amplified digital signals from the digital power amplifier as the drive signal to the capacitive load, and a phase-lead compensator that performs phase-lead compensation on the drive signal from the inductive element, then, negatively feeds back the obtained signal as the feedback signal to the arithmetic circuit, and thereby, suppresses resonance characteristics generated between the inductive element and the capacitive load so that gain of the drive signal relative to the amplified digital signal may fall in a range of 1.5 times to 5 times of the gain of the power amplifier.

In the capacitive load drive circuit according the aspect of the invention, the drive signal is applied to the capacitive load in the following manner. First, the error signal is generated by computing the difference between the drive waveform signal as the reference for the drive signal and the feedback signal generated from the drive signal actually applied to the capacitive load. Then, the modulated signal is generated by pulse modulation of the error signal and the obtained modulated signal is power-amplified, and the pulsed amplified digital signal is generated. The amplified digital signal is supplied via the inductive element to the capacitive load, and thereby, the drive signal is applied to the capacitive load. The inductive element forms the low pass filter in combination with the capacitive load, and thus, by supplying the pulsed amplified digital signal via the inductive element to the capacitive load, the modulated component of the amplified digital signal is removed and the power-amplified signal component (drive waveform signal) is applied as the drive signal to the capacitive load. The inductive element and the capacitive load are combined to form the resonator, and, at the resonance frequency determined by inductance of the inductive element and capacitance of the capacitive load, the voltage of the drive signal applied to the capacitive load is larger than the amplified digital signal supplied to the inductive element. Accordingly, compensation to make the phase ahead of the drive signal applied to the inductive element (phase-lead compensation) is performed, then, the obtained signal is negatively fed back to the arithmetic circuit as the feedback signal, and thereby, the resonance characteristics between the inductive element and the capacitive load are suppressed. Note that the resonance characteristics are not completely suppressed, but the resonance characteristics are suppressed so that the gain of the drive signal relative to the amplified digital signal may fall in a range from about 1.5 times to 5 times.

The resonator formed by the inductive element and the capacitive load generates a sharp resonance peak near the resonance frequency determined by the inductance of the inductive element and the capacitance of the capacitive load. The inductance of the inductive element and the capacitance of the capacitive load fluctuate due to ambient temperature changes and manufacturing variations of the elements. Therefore, the resonance frequency fluctuates due to the influences, and the gain of the drive signal for the amplified digital signal largely fluctuates. The temperatures of the inductive element and the capacitive load rise due to power loss in use, and the gain may largely fluctuate during driving of the capacitive load. On the other hand, in the capacitive load drive circuit of the aspect of the invention, the resonance characteristics are suppressed by performing phase-lead compensation on the drive signal applied to the inductive element and negatively feeding back it, and the gain does not fluctuate around the resonance frequency. Accordingly, even when the resonance frequency fluctuates due to ambient temperature changes and manufacturing variations of the elements, the gain of the drive signal relative to the amplified digital signal does not largely fluctuate. Here, in view of suppression of fluctuations in gain, it is desirable to suppress the resonance characteristics as much as possible. On the other hand, in view of generation of the largest drive signal relative to the amplified digital signal, it is desirable not to suppress the resonance characteristics as much as possible. That is, suppression of fluctuations in gain and securement of large gain have a trade-off relationship. Experience shows that, if the resonance characteristics are suppressed so that the gain of the drive signal relative to the amplified digital signal may fall within a range from 1.5 times to 5 times, the gain to some degree may be secured while the fluctuations in gain of the drive signal to the amplified digital signal are suppressed. As a result, the drive signal having a voltage exceeding the voltage of the amplified digital signal may be generated and the stable drive signal without being affected by the ambient temperature, manufacturing variations of parts, etc. may be generated.

In the above described capacitive load drive circuit according the aspect of the invention, a capacitive element connected in parallel to the capacitive load may be provided.

As described above, the capacitive load drive circuit according the aspect of the invention amplifies the drive signal relative to the amplified digital signal using a resonance phenomenon occurring between the inductive element and the capacitive load. Therefore, the effect is obtained in the frequency range around the resonance frequency of the resonator. The resonance frequency is determined by the inductance of the inductive element and the capacitance of the capacitive load, and the capacitance of the capacitive load is determined to some degree depending on the magnitude, characteristics, or the like of the capacitive load. Therefore, to obtain a desired resonance frequency, the inductance of the inductive element should be made larger and a larger inductive element may be necessary. In this case, the capacitive element (capacitor or the like) is connected in parallel to the capacitive load, and thereby, the capacitive load having the combined capacitance of the capacitive load and the capacitive element appears to be connected from the inductive element though the capacitance of the capacitive load is not changed. Accordingly, it is not necessary to mount a larger inductive element, and upsizing of the capacitive load drive circuit is avoidable.

In the above described capacitive load drive circuit according the aspect of the invention, pulse width modulation may be performed in response to the error signal when the error signal is pulse-modulated and the modulated signal is generated.

The pulse width modulation may be realized using an extremely simple circuit, and a compact capacitive load drive circuit may be easily realized.

In the above described capacitive load drive circuit according the aspect of the invention, pulse density modulation may be performed in response to the error signal when the error signal is pulse-modulated and the modulated signal is generated.

The detailed mechanism will be described later, and pulse modulation may be performed to suppress the influence of fluctuations of the power supply voltage or the like using the pulse density modulation. Accordingly, even when the power supply voltage fluctuates for some reason, a stable drive signal may be generated without being affected by the fluctuation.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
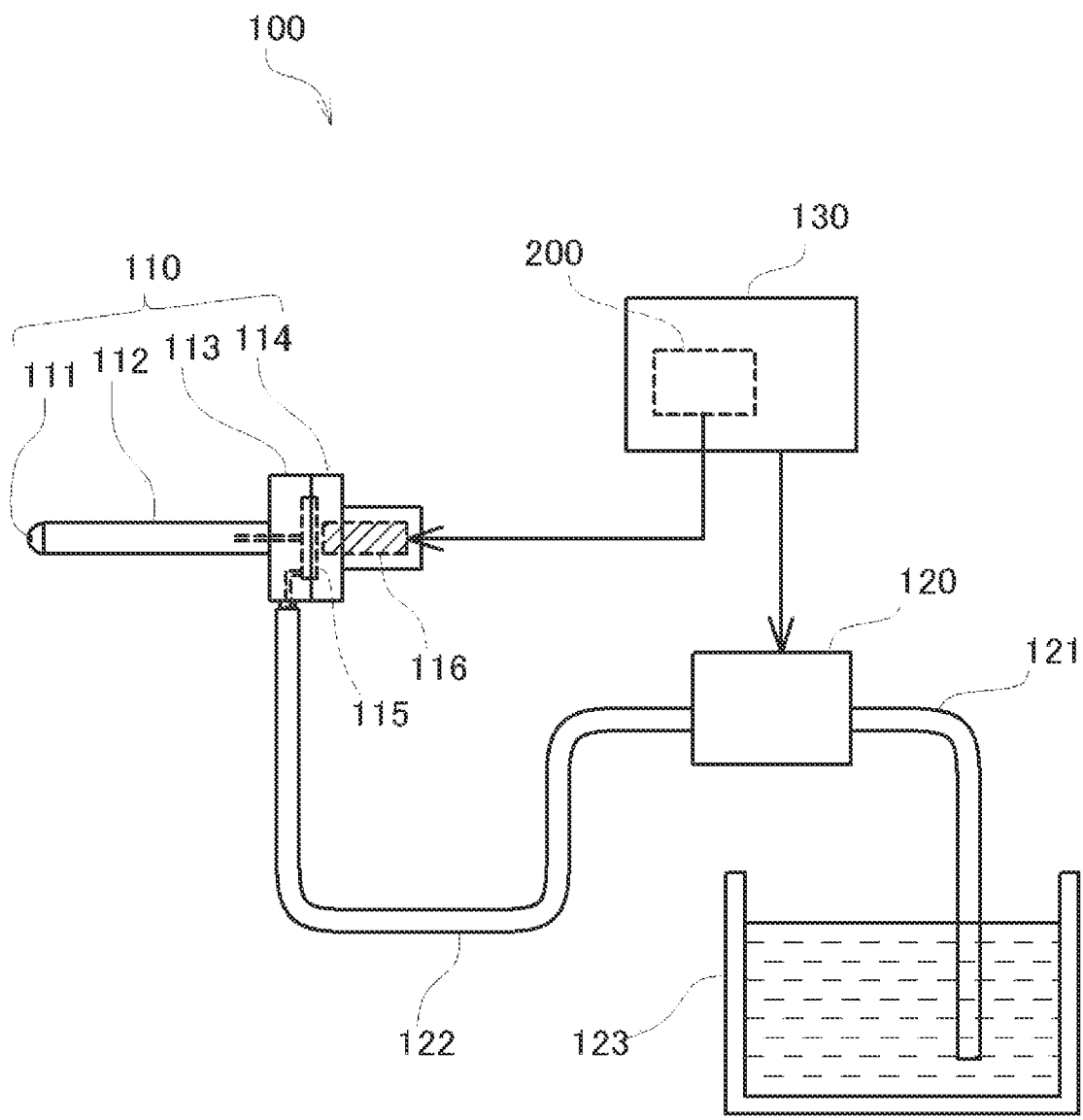
FIG. 1 is an explanatory diagram illustrating a liquid injector with a capacitive load drive circuit of the embodiment.

As below, for clarification of the above described invention, embodiments will be explained in the following order.
A. Device Configuration
B. Circuit Configuration of Capacitive Load Drive Circuit
C. Operation of Capacitive Load Drive Circuit
D. Modified Examples
D-1. First Modified Example
D-2. Second Modified Example A. Device Configuration FIG. 1 is an explanatory diagram showing a configuration of a liquid injector 100 with a capacitive load drive circuit 200 of the embodiment. As illustrated, the liquid injector 100 roughly includes an injection unit 110 that injects a liquid, a supply pump 120 that supplies the liquid to be injected from the injection unit 110 toward the injection unit 110, a control unit 130 that controls operations of the injection unit 110 and the supply pump 120, etc. For example, the injection unit 110 corresponds to a water jet knife for medical use in operations or the like, however, is not limited to the water jet knife.

The injection unit 110 has a structure in which a front block 113 made of a metal and a rear block 114 similarly made of a metal are joined and screwed, and a liquid channel pipe 112 having a circular pipe shape is stood on the front surface of the front block 113 and an injection nozzle 111 is inserted into the end of the liquid channel pipe 112. A liquid chamber 115 having a thin circular plate shape is formed on the joined surfaces of the front block 113 and the rear block 114, and the liquid chamber 115 is connected to the injection nozzle 111 via the liquid channel pipe 112. Within the rear block 114, an actuator 116 including a multilayer piezoelectric device is provided. The supply pump 120 pumps a liquid via a tube 121 from a liquid tank 123 storing the liquid (water, saline, chemical solution, or the like) to be injected, and then, supplies it into the liquid chamber 115 of the injection unit 110 via a tube 122. Accordingly, the liquid chamber 115 is filled with the liquid.

When a drive signal is applied from the control unit 130 to the actuator 116, the actuator 116 expands and compresses the liquid chamber 115 and, as a result, the liquid filling the liquid chamber 115 is injected from the injection nozzle 111 in a pulsed form. The amount of expansion of the actuator 116 depends on the voltage applied as the drive signal. Therefore, to sufficiently get the performance of the actuator 116, it is necessary to generate a drive signal with accuracy that can output a large voltage amplitude and apply it to the actuator 116. Accordingly, to generate such a drive signal, the capacitive load drive circuit 200 of the embodiment explained as below is mounted within the control unit 130.

B. Circuit Configuration of Capacitive Load Drive Circuit

Figure 2:
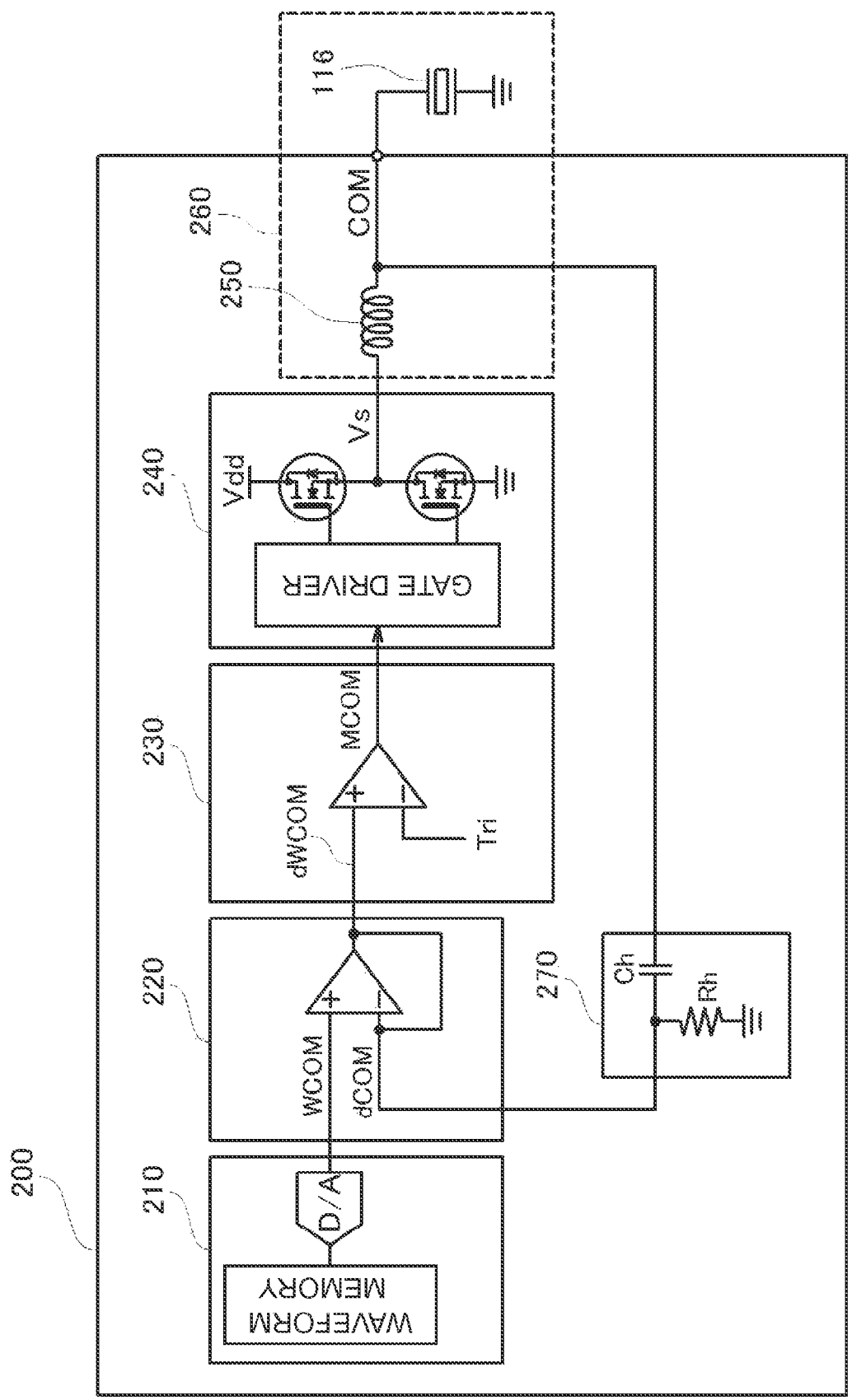
FIG. 2 is an explanatory diagram showing a circuit configuration of the capacitive load drive circuit of the embodiment.

FIG. 2 is an explanatory diagram showing a circuit configuration of the capacitive load drive circuit 200 of the embodiment. As illustrated, the capacitive load drive circuit 200 roughly includes a drive waveform generator (drive waveform signal output circuit) 210 that outputs a drive waveform signal (hereinafter, referred to as "WCOM") as a reference for the drive signal, an arithmetic circuit 220 that outputs an error signal (hereinafter, referred to as "dWCOM") based on the WCOM received from the drive waveform generator 210 and a feedback signal (hereinafter, referred to as "dCOM"), which will be described later, a modulator 230 that pulse-modulates the dWCOM from the arithmetic circuit 220 and converts it into a modulated signal (hereinafter, referred to as "MCOM"), a digital power amplifier 240 that digitally power-amplifies the MCOM from the modulator 230 and generates an amplified digital signal (hereinafter, referred to as "Vs"), a coil 250 (inductive element) that receives the Vs from the digital power amplifier 240 and removes the modulated component, and then, supplies it as a drive signal (hereinafter, referred to as "COM") to the actuator 116 of the injection unit 110, and a phase-lead compensator 270 that performs compensation to make the phase ahead of the COM supplied from the coil 250 to the actuator 116 and generates the dCOM (feedback signal).

Of them, the drive waveform generator 210 includes a waveform memory that stores data of the WCOM and a D/A converter, and generates the WCOM (drive waveform signal) by converting the data read from the waveform memory into an analog signal using the D/A converter. Thus output WCOM is input to a noninverting input terminal of the arithmetic circuit 220. The dCOM (feedback signal) from the phase-lead compensator 270 is input to an inverting input terminal of the arithmetic circuit 220. As a result, a signal corresponding to the difference between the WCOM and the dCOM is output as the dWCOM (error signal) from the arithmetic circuit 220.

Subsequently, the dWCOM is compared to a triangular wave (hereinafter, referred to as "Tri") at a constant frequency, and generates the pulsed MCOM (modulated signal) in the High state (the operating voltage of the modulator 230) if the dWCOM is larger, and in the Low state (the ground voltage) if the Tri is larger. Then, the obtained MCOM is input to the digital power amplifier 240. The digital power amplifier 240 includes two push-pull-connected switch elements (MOSFET or the like), a power supply, and a gate driver that drives these switch elements. If the MCOM is in the High state, the switch element at the high side turns ON and the switch element at the low side turns OFF, and the voltage Vdd of the power supply is output as the Vs. If the MCOM is in the Low state, the switch element at the high side turns OFF and the switch element at the low side turns ON, and the ground voltage is output as the Vs. Therefore, the MCOM that changes like pulse wave between the operating voltage of the modulator 230 and the ground may be power-amplified to the Vs that changes like pulse wave between the voltage Vdd of the power supply and the ground.

In the amplification, only switching ON/OFF of the two push-pull-connected switch elements is performed, and the power loss may be largely suppressed compared to that in the case of amplification of analog waveforms. As a result, the power efficiency may be improved and a large heat sink is no longer necessary for heat radiation, and thus, the circuit can be downsized.

The power amplified Vs (amplified digital signal) is passed through the coil 250, and then, applied to the actuator 116 as the COM (drive signal). The details will be described later, and the coil 250 forms a low pass filter 260 by being combined with a capacity component of the actuator 116. The modulated component in the Vs is attenuated by the low pass filter 260, and the signal component in the Vs is extracted and demodulated as the COM. In addition, in the capacitive load drive circuit 200 of the embodiment, not only the Vs is passed through the coil 250 and the modulated component is attenuated but also the signal component in the Vs is amplified (amplified in a range from 1.5 times to 5 times, typically, about twice). Accordingly, in the digital power amplifier 240, though the voltage is only power-amplified to the voltage Vdd, the COM containing the voltage equal to or more than the voltage Vdd may be output. The reason for the availability of the output will be explained later in detail.

The feedback control system is formed by negative feedback of the COM applied to the actuator 116, however, the COM that has passed through the coil 250 is delayed in phase relative to the WCOM due to the phase characteristic of the low pass filter 260. Accordingly, the COM is not simply negatively fed back, but compensation for advancing the phase through the phase-lead compensator 270 including a capacitor Ch and a resistor Rh is performed and the obtained signal is input as the dCOM to the inverting input terminal of the arithmetic circuit 220, and thereby, the COM is negatively fed back.

C. Operation of Capacitive Load Drive Circuit

Figures 3A, 3B, 3C, 3D:
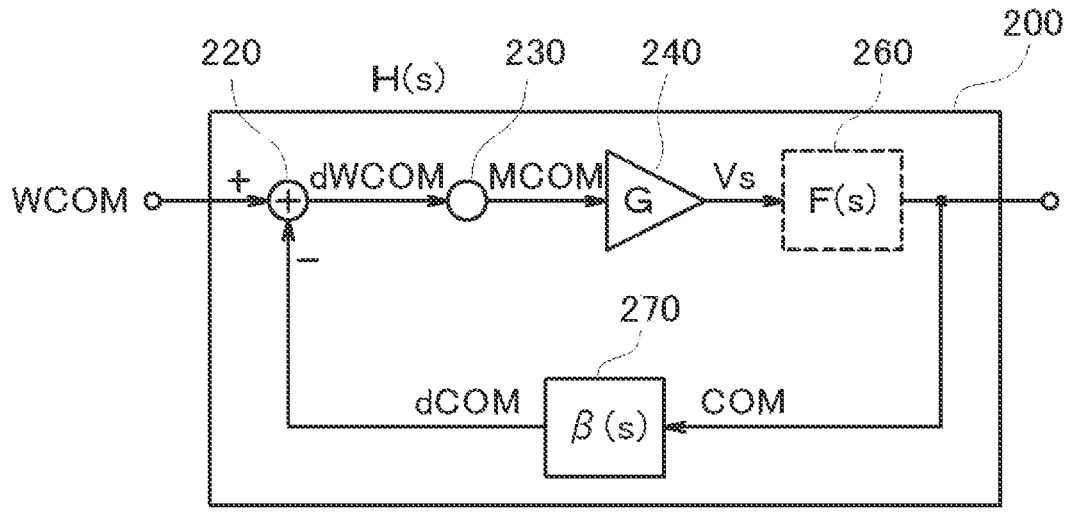
FIG. 3A is a block diagram for analysis of frequency response characteristics of the capacitive load drive circuit of the embodiment and FIGS. 3B to 3D show expressions used therefor.

FIG. 3A is a block diagram for analysis of frequency response characteristics of the capacitive load drive circuit 200 of the embodiment. First, the dCOM (feedback signal) from the phase-lead compensator 270 is subtracted from the WCOM (drive waveform signal) from the drive waveform generator 210 by the arithmetic circuit 220, and the dWCOM (error signal) is generated. The dWCOM is converted into the MCOM (modulated signal) by the modulator 230, then, amplified by the digital power amplifier 240 and converted into Vs (amplified digital signal), and demodulated by the low pass filter 260 and output as the COM (drive signal). Thus output COM is subjected to phase-lead compensation by the phase-lead compensator 270, then, negatively fed back with respect to the WCOM as the dCOM, and the configuration forms a feedback control system as a whole.

Here, given that the inductance of the coil 250 is L and the capacitance of the actuator 116 (piezoelectric device) is Cp, the transfer function F(s) of the low pass filter 260 is given by an expression shown in FIG. 3B. The transfer function β(s) of the phase-lead compensator 270 is given by an expression shown in FIG. 3C. Here, Ch represents the capacitance of the capacitor forming the phase-lead compensator 270, and Rh represents the resistance value of the resistor forming the phase-lead compensator 270. Therefore, given that the gain at power amplification by the digital power amplifier 240 is G, the transfer function H(s) of the entire capacitive load drive circuit 200 is given by an expression shown in FIG. 3D.

Figure 4A:
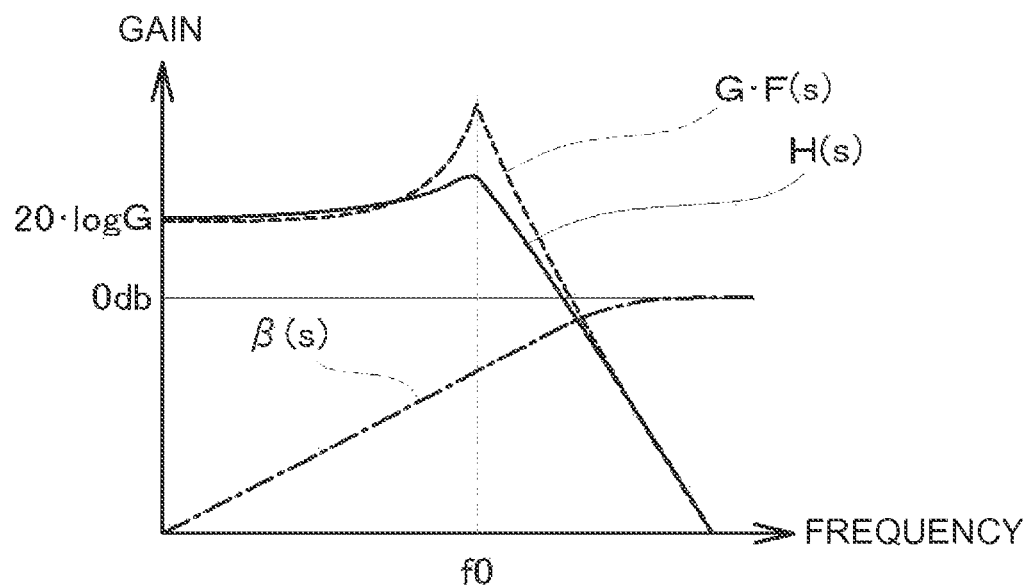
FIGS. 4A and 4B are Bode diagrams showing frequency response characteristics of the capacitive load drive circuit of the embodiment.
Figure 4B:
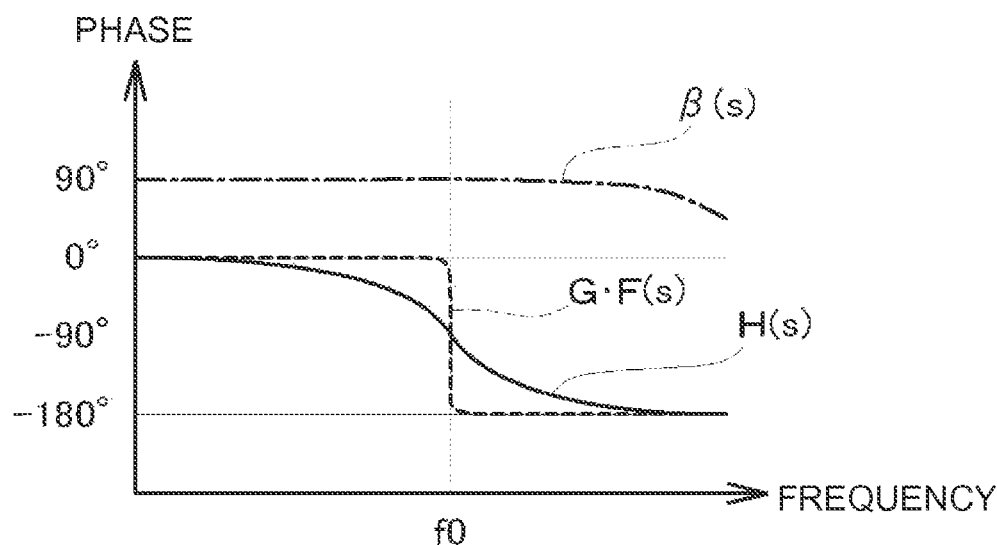

FIGS. 4A and 4B are Bode diagrams showing the frequency response characteristics of the transfer function H(s) of the entire capacitive load drive circuit 200. FIG. 4A shows a gain diagram and FIG. 4B shows a phase diagram. The gain diagram and the phase diagram also show the characteristic of the transfer function G·F(s) of the low pass filter 260 including the digital power amplifier 240 and the transfer function β(s) of the phase-lead compensator 270 in addition to the characteristics of the transfer function H(s) of the entire capacitive load drive circuit 200.

As shown by a dashed line in the gain diagram of FIG. 4A, the induction component of the coil 250 forms a resonator with the capacity component of the actuator 116 (piezoelectric device), and a sharp peak of gain appears near the resonance frequency of f0 determined from the calculation formula shown in the drawing. Then, by negative feedback of the COM, the sharpness of the peak (Q-value) is suppressed. Note that, as shown in FIG. 4B, because of the phase characteristics of the low pass filter 260, the phase of the COM is delayed to 180 degrees in a frequency domain higher than the resonance frequency f0, and, if the COM is negatively fed back without change, the control unit 130 may be unstable. Accordingly, after the compensation to make the phase ahead using the phase-lead compensator 270 having the characteristics shown by dashed and single-dotted lines in FIGS. 4A and 4B, the COM is negatively fed back as the dCOM (feedback signal). In this manner, the COM may be negatively fed back without making the control unit 130 unstable, and, as a result, as shown by a solid line in FIG. 4A, the sharpness of the peak (Q-value) appearing in the gain diagram may be suppressed.

Here, in the capacitive load drive circuit 200 of the embodiment, the peak of the gain is not completely suppressed, but the peak is left to some degree. Accordingly, in the frequency domain around the resonance frequency f0, larger gain than the gain G of the digital power amplifier 240 may be obtained. Obviously, since the COM is negatively fed back, the gain change is milder compared to the transfer function G·F(s) of the digital power amplifier 240 and the low pass filter 260. On this account, even when the resonance frequency changes due to the influences of the ambient temperature, the temperature change of the actuator 116, and manufacturing variations of the coil 250 and the actuator 116, the gain does not largely change due to the influences. As a result, while the COM (drive signal) containing the voltage equal to or more than that power-amplified by the digital power amplifier 240 may be output, the stable COM may be output without being affected by the ambient temperature and manufacturing variations of parts.

As is clear from the above explanation, in view of suppression of fluctuations in gain, it is desirable to suppress the resonance characteristics as much as possible. On the other hand, in view of generation of the largest COM (drive signal) relative to the Vs (amplified digital signal), it is desirable not to suppress the resonance characteristics as much as possible. That is, suppression of fluctuations in gain and securement of large gain have a trade-off relationship. Experience shows that, if the resonance characteristics are suppressed so that the gain of the COM relative to the Vs may fall within a range from 1.5 times to 5 times (typically, the gain may be about twice), the stable COM may be generated while the gain to some degree is secured.

Figure 5A:
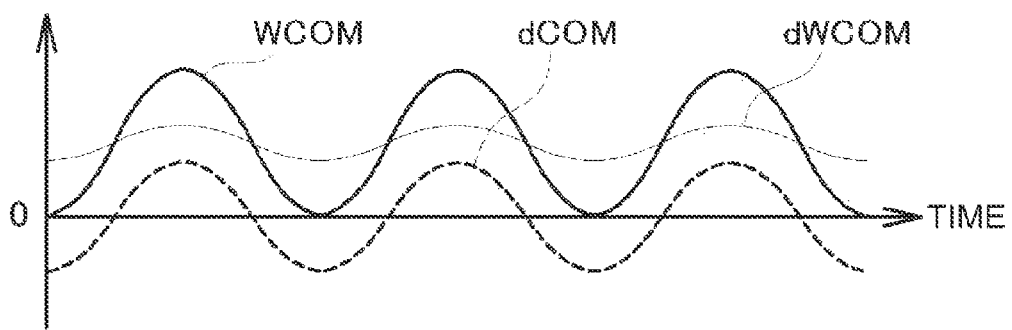
FIGS. 5A to 5E are explanatory diagrams showing states in which the capacitive load drive circuit of the embodiment generates a drive signal from a drive waveform signal.

FIGS. 5A to 5E are explanatory diagrams illustrating operations of the capacitive load drive circuit 200 of the embodiment of generating the COM (drive signal) from the WCOM (drive waveform signal). The thick solid line shown in FIG. 5A represents the WCOM output from the drive waveform generator 210. The dashed line shown in FIG. 5A represents the dCOM (feedback signal) from the phase-lead compensator 270. As has been described using FIG. 2, since the WCOM is input to the noninverting input terminal of the arithmetic circuit 220 and the dCOM is input to the inverting input terminal of the arithmetic circuit 220, the signal of the difference obtained by subtraction of the dCOM from the WCOM is output as the dWCOM (error signal) from the arithmetic circuit 220. The dWCOM is pulse-modulated into the MCOM (modulated signal) by the modulator 230.

Figure 5B:
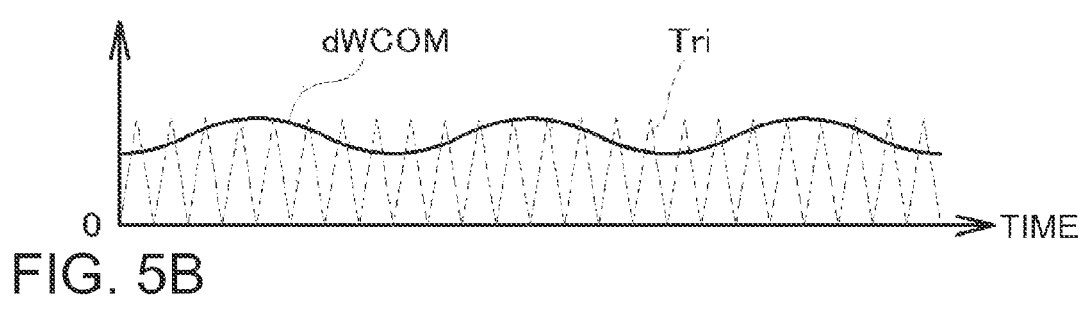
Figure 5C:
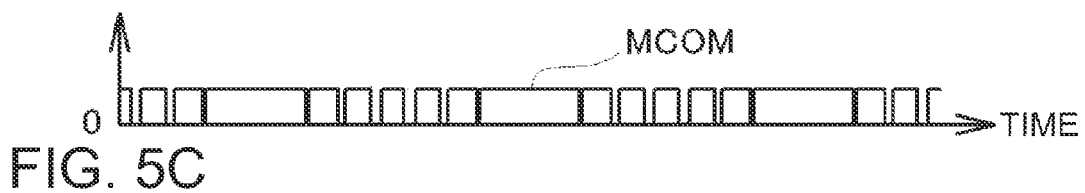

FIG. 5B shows a state in which the dWCOM is converted into the MCOM by the modulator 230. In the modulator 230, the dWCOM represented by a thick solid line and the Tri (triangular wave) represented by a thin dashed line in FIG. 5B are compared. If the dWCOM is larger, the operating voltage of the modulator 230 is output (High state) and, if the Tri is larger, the ground voltage is output (Low state). As a result, the modulated signal (MCOM) having the voltage changing like pulse wave between the ground voltage and the operating voltage of the modulator 230 is generated. FIG. 5C shows thus obtained MCOM.

Figure 5D:
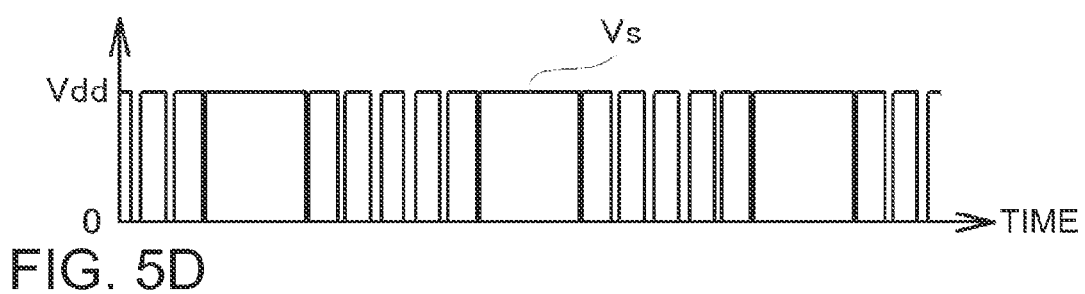

Subsequently, the MCOM is power-amplified by the digital power amplifier 240. As has been described using FIG. 2, the digital power amplifier 240 switches the connection states of the two push-pull-connected switch elements (MOSFET or the like) by the MCOM, and thereby, the pulse waveform switching between the voltage Vdd of the power supply and the ground voltage as shown in FIG. 5D, i.e., the Vs (amplified digital signal) is generated. The Vs is passed through the coil 250, and the modulated component is removed and the signal component is demodulated.

Figure 5E:
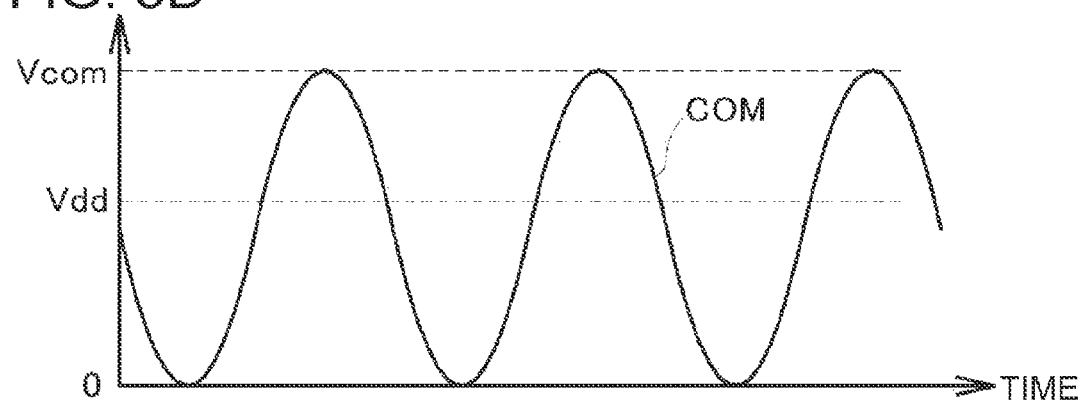

Thus demodulated signal component has the maximum voltage larger than that of the original signal (WCOM) in response to the power amplification of the MCOM by the digital power amplifier 240. In addition, as has been described using FIG. 4A, since the gain of the transfer function H(s) is larger than the gain G of the digital power amplifier 240, the maximum voltage of the signal component demodulated from the Vs is larger than the maximum voltage (voltage Vdd) of the Vs. Further, since the gain of the transfer function H(s) gently changes in the wider frequency domain containing the resonance frequency f0 of the low pass filter 260, the waveform is not distorted when the signal component contained in the Vs is demodulated. As a result, as illustrated in FIG. 5E, the WCOM output from the drive waveform generator 210 containing a voltage Vcom larger than the maximum voltage (voltage Vdd) of the Vs may be obtained as the COM (drive signal).

The resonance frequency f0 of the low pass filter 260 is determined by the inductance L of the coil 250 and the capacitance Cp of the actuator 116 (piezoelectric device), and the resonance frequency f0 changes due to influences of ambient temperature changes and manufacturing variations of the coil 250 and the actuator 116 (piezoelectric device). However, as has been described using FIG. 4A, since the gain of the transfer function H(s) gently changes in the wider frequency domain containing the resonance frequency f0 of the low pass filter 260, even when the resonance frequency f0 changes, the gain does not largely change according to the change. As a result, without being affected by the ambient temperature changes and manufacturing variations of the coil 250 and the actuator 116 (piezoelectric device), the COM (drive signal) containing the voltage Vcom larger than the maximum voltage (voltage Vdd) of the Vs may be stably generated.

D. Modified Examples

For the above described capacitive load drive circuit 200 of the embodiment, there are several modified examples. As below, these modified examples will be briefly explained. In the following modified examples, the same signs as those of the embodiments will be assigned to the same component parts as those of the above described embodiment, and their detailed explanation will be omitted.

D-1. First Modified Example

In the above described embodiment, the modulator 230 has been explained to perform pulse modulation of the dWCOM using a method of the so-called pulse width modulation (PWM). However, the method of pulse modulation is not limited to the pulse width modulation, but pulse modulation may be performed using a method of the so-called pulse density modulation (PDM). As below, the first modified example of modulation using the method called pulse density modulation will be explained.

Figure 6:
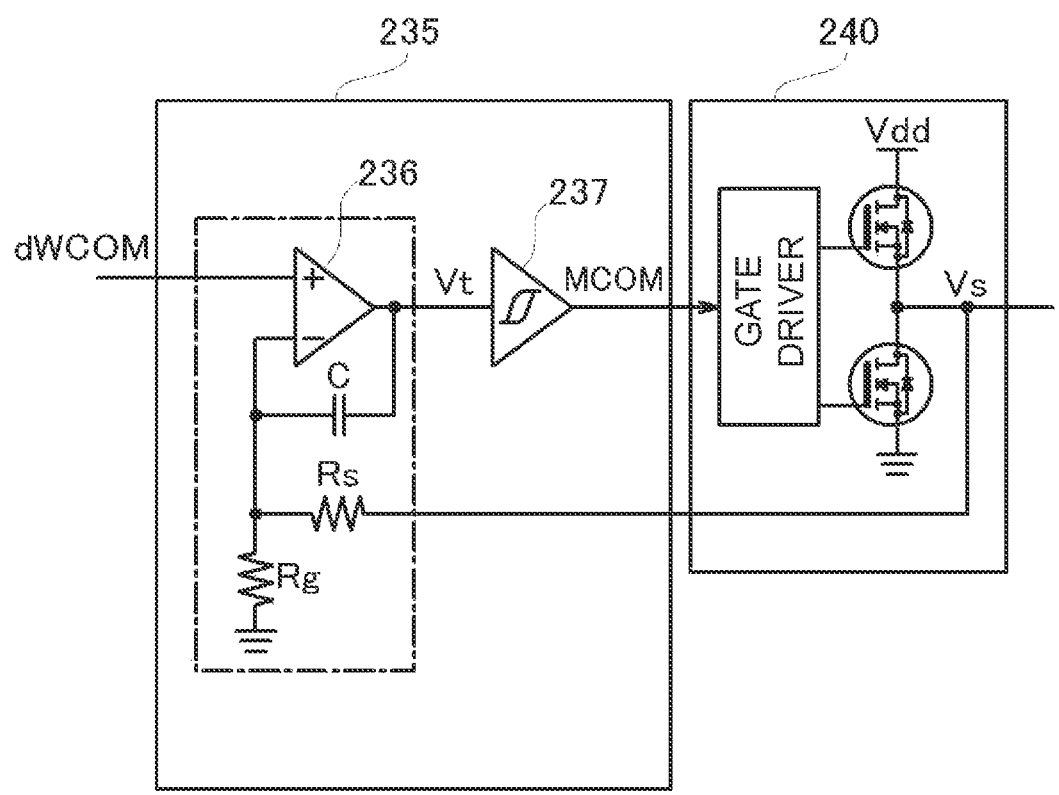
FIG. 6 is an explanatory diagram showing circuit configurations of a modulator and a digital power amplifier used in a capacitive load drive circuit of a first modified example.

FIG. 6 is an explanatory diagram showing circuit configurations of a modulator 235 and a digital power amplifier circuit 240 used in a capacitive load drive circuit 200 of the first modified example. The modulator 235 of the first modified example includes an integrator 236 that integrates the difference between a dWCOM (error signal) and a signal obtained by voltage division of the Vs (amplified digital signal) from the digital power amplifier 240 using a resistor Rs and a resistor Rg, and a hysteresis comparator 237 that pulse-modulates the integrated signal obtained by the integrator 236 (hereinafter, referred to as "Vt"). Here, the hysteresis comparator 237 is a comparator in which a threshold value th1 for the output to switch from the Low state to the High state and a threshold value th2 (th1>th2) for the output to switch from the High state to the Low state are set to different values.

Figure 7A:
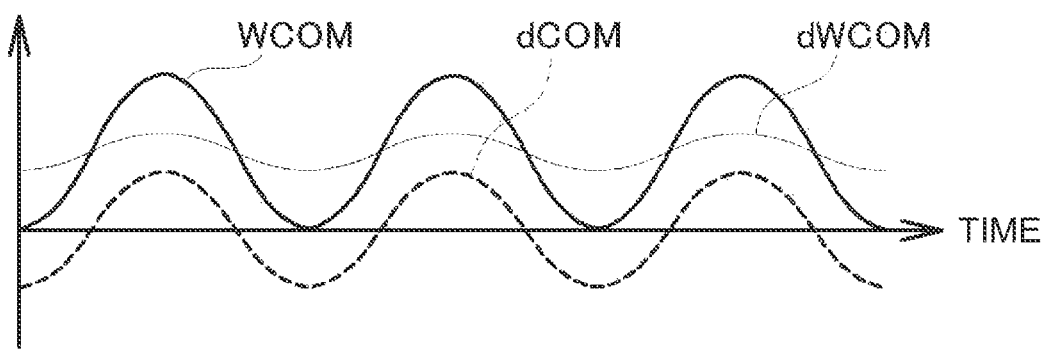
FIGS. 7A to 7E are explanatory diagrams showing states in which the capacitive load drive circuit of the first modified example generates a drive signal from a drive waveform signal.

FIGS. 7A to 7E are explanatory diagrams illustrating operations of the capacitive load drive circuit 200 of the first modified example of generating a COM (drive signal) from a WCOM (drive waveform signal). The thick solid line shown in FIG. 7A represents a WCOM output from the drive waveform generator 210, and the dashed line shown in FIG. 7A represents a dCOM (feedback signal) from the phase-lead compensator 270. Also, in the capacitive load drive circuit 200 of the first modified example, the dWCOM (error signal) is generated by subtraction of the dCOM from the WCOM. The dWCOM is input to the modulator 235 shown in FIG. 6 for pulse modulation.

Figure 7B:
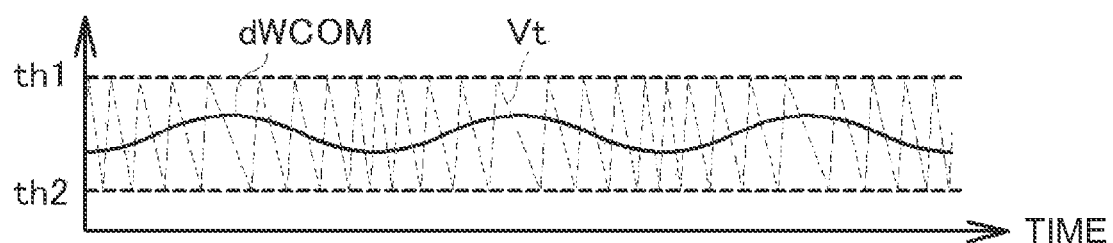
Figure 7C:
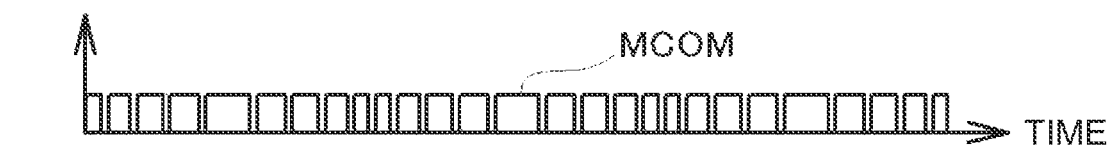

FIG. 7B shows an operation of the integrator 236 of the modulator 235. As shown in FIG. 6, the integrator 236 generates the Vt (integrated signal) by integrating the difference between the dWCOM (error signal) and the signal obtained by voltage division of the Vs (amplified digital signal) from the digital power amplifier 240 using the resistor Rs and the resistor Rg. Therefore, if the difference is larger, the Vt rapidly changes and, if the difference is smaller, the Vt is slowly changes, and consequently, forms a triangular wave shown by a thin dashed line in FIG. 7B. By pulse-modulating the Vt using the hysteresis comparator 237, the MCOM shown in FIG. 7C may be obtained.

Figure 7D:
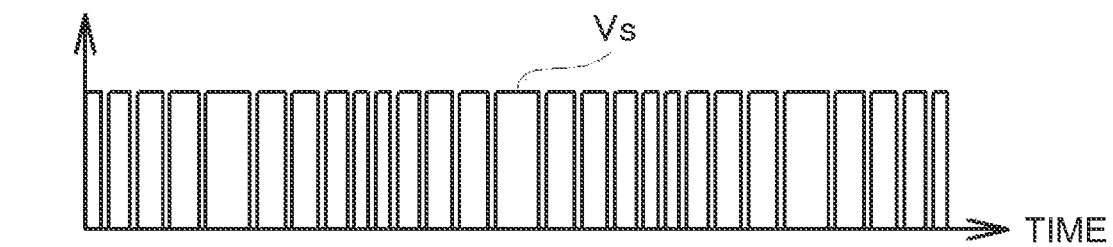
Figure 7E:
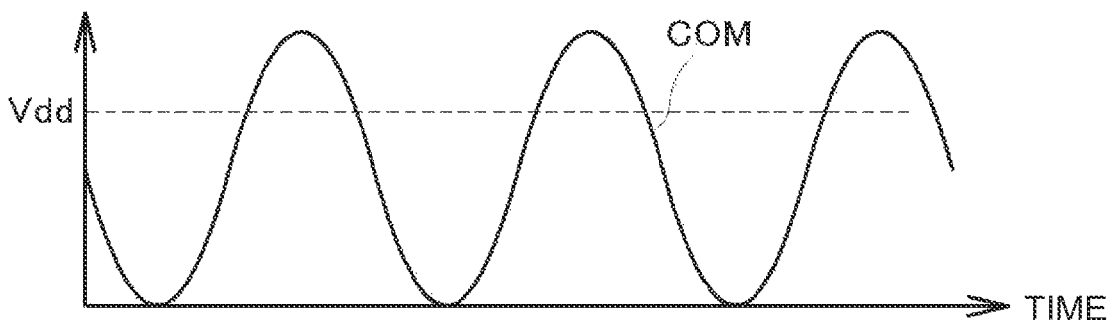

After the MCOM is obtained, the Vs (amplified digital signal) shown in FIG. 7D is generated by power-amplifying the obtained MCOM using the digital power amplifier 240, and then, the Vs is passed through the coil 250 and the signal component is demodulated. In this manner, the power amplified COM may be obtained as shown in FIG. 7E.

In the above described first modified example, in the frequency domain containing the resonance frequency f0 of the low pass filter 260, by setting the gain of the COM relative to the Vs in a range from 1.5 times to 5 times, the COM including a voltage higher than the power supply voltage Vdd of the digital power amplifier 240 may be generated. As clearly seen from the gain diagram of the transfer function H(s), the gain of the COM relative to the Vs gently changes, and thus, the waveform is not distorted when the signal component is demodulated from the Vs and the COM is generated. Further, without being affected by the ambient temperature changes and manufacturing variations of the coil 250 and the actuator 116 (piezoelectric device), the COM (drive signal) containing the voltage larger than the power supply voltage Vdd of the digital power amplifier 240 may be stably generated.

In addition, as described above, in the case of the pulse modulation in the PDM method as in the modified example, compared to the case of pulse modulation by the above described PWM method, the following advantages may be obtained. First, the Vs obtained by the digital power amplifier 240 has a pulse waveform with a voltage value changing between the ground voltage and the power supply voltage Vdd. Therefore, when the power supply voltage Vdd fluctuates for some reason, the amplitude of the Vs changes. Accordingly, in the case of the pulse modulation by the PWM method, fluctuations of the power supply voltage Vdd of the digital power amplifier 240, variations of characteristics of the transistor, and the like directly affect the COM. However, in the case of the pulse modulation by the PDM method, the influences of the fluctuations of the power supply voltage Vdd of the digital power amplifier 240 and variations of characteristics of the transistor on the COM may be suppressed for the following reasons.

First, in the PDM method, the Vt (integrated signal) to be input to the hysteresis comparator 237 is obtained by integrating the difference between the dWCOM from the arithmetic circuit 220 and the value obtained by voltage-dividing the Vs from the digital power amplifier 240. Therefore, when the power supply voltage Vdd of the digital power amplifier 240 becomes lower, the gradient of the fall of the Vt becomes gentler. As a result, the period in which the MCOM output from the hysteresis comparator 237 is in the High state becomes longer. When the power supply voltage Vdd of the digital power amplifier 240 rises, the gradient of the fall of the Vt becomes sharper. As a result, the period in which the MCOM output from the hysteresis comparator 237 is in the Low state becomes longer.

That is, when the power supply voltage Vdd of the digital power amplifier 240 becomes lower for some reason, the period in which the MCOM is in the High state becomes longer, and when the power supply voltage Vdd of the digital power amplifier 240 becomes higher, the period in which the MCOM is in the Low state becomes longer. When the period in which the MCOM is in the High state becomes longer, the voltage obtained after passing through the low pass filter becomes higher and, when the period in which the MCOM is in the Low state becomes longer, the voltage obtained after passing through the low pass filter becomes lower. Consequently, when the power supply voltage Vdd of the digital power amplifier 240 fluctuates, the MCOM changes so that the influence may not appear in the COM. Accordingly, in the case of the pulse modulation using the PDM method, the stable COM (drive signal) may be constantly generated without being affected by the fluctuation of the power supply voltage Vdd.

D-2. Second Modified Example

In the above described embodiment or modified example, the low pass filter 260 has been explained to include the coil 250 and the actuator 116 (piezoelectric element). However, a capacitor may be provided to be connected in parallel to the actuator 116 and the low pass filter 260 may include the capacitor, the coil 250, and the actuator 116.

Figure 8:
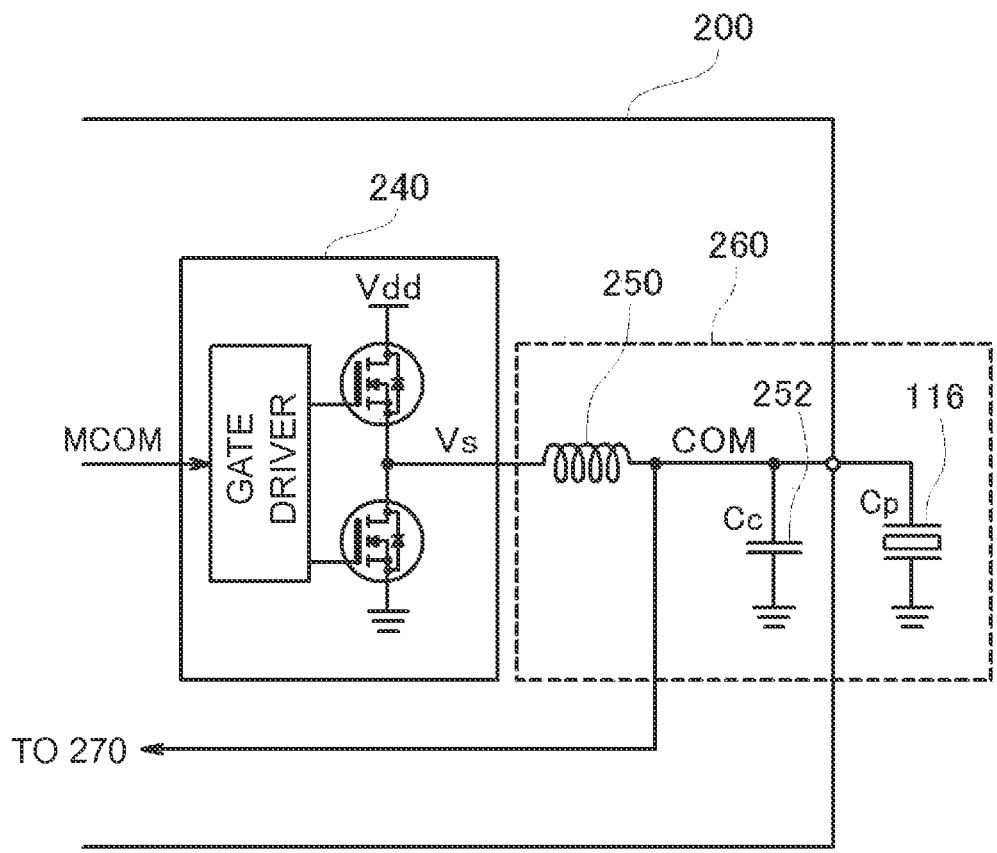
FIG. 8 is an explanatory diagram showing a part of a capacitive load drive circuit of a second modified example.

FIG. 8 is an explanatory diagram showing a part of a capacitive load drive circuit 200 of a second modified example having the configuration. As shown in the drawing, in the capacitive load drive circuit 200 of the second modified example, a capacitor 252 (capacitive element) is provided to be connected in parallel to the actuator 116. In the configuration, a resonator is formed by inductance L of the coil 250, capacitance Cp of the actuator 116, and capacitance Cc of the capacitor 252. The capacitance Cp of the actuator 116 and the capacitance Cc of the capacitor 252 connected in parallel to each other may be handled as combined capacitance (having a magnitude of Cp+Cc), and thus, the resonance frequency of the resonator is a frequency determined by the inductance L of the coil 250 and the combined capacitance Cp+Cc.

The capacitance Cp of the actuator 116 as a drive load of the capacitive load drive circuit 200 is predetermined in many cases. Therefore, if there is no capacitor 252, in order to set the resonance frequency to a desired frequency, it is necessary to adjust the inductance L of the coil 250. As a result, in some cases, the larger coil 250 may be necessary and the capacitive load drive circuit 200 may be larger. However, in this case, if the capacitor 252 is connected in parallel to the actuator 116, by appropriately setting the capacitance of the capacitor 252, the resonance frequency may be set to a desired frequency without upsizing of the coil 250.

As above, the capacitive load drive circuits of the embodiment and the modified examples have been explained. However, the invention is not limited to all of the embodiment and modified examples, but may be embodied in various forms without departing from the scope thereof. For example, by applying the capacitive load drive circuit of the embodiment to various electronic equipment including medical devices such as a fluid injector used for formation of microcapsules containing drugs and nutrients, downsized electronic equipment with high power efficiency may be provided. The invention may be preferably applied to a capacitive load drive circuit mounted on an inkjet printer for driving an injection nozzle for injecting ink.

This application claims priority to Japanese Patent Application No. 2010-254581, filed on Nov. 15, 2010, the entirety of which is hereby incorporated by reference.

What is claimed is:

1. A liquid injector comprising:
an actuator for injecting a liquid; and
a capacitive load drive circuit that generates a drive signal for driving the actuator,
The capacitive load drive circuit that drives a capacitive load by applying a predetermined drive signal to the capacitive load having a capacitive component, the circuit comprising:
a drive waveform signal output circuit that outputs a drive waveform signal as a reference for the drive signal in a form of a digital signal;
an arithmetic circuit that generates an error signal by computing a difference between the drive waveform signal and a feedback signal generated using the drive signal;
a modulator that generates a modulated signal by pulse modulation of the error signal;
a digital power amplifier that generates an amplified digital signal by power amplification of the modified signal;
an inductive element that connects the digital power amplifier and the capacitive load and applies the drive signal to the capacitive load; and
a phase-lead compensator that negatively feeds back a signal obtained by phase-lead compensation of the drive signal to the arithmetic circuit as the feedback signal,
wherein the phase-lead compensator suppresses gain near a resonance frequency of a resonator formed by the inductive element and the capacitive load in a range of 1.5 times to 5 times of gain of the power amplifier.

2. A liquid injector according to claim 1, further comprising a capacitive element connected in parallel to the capacitive load,
wherein the resonator is formed by the capacitive load, the capacitive element, and the inductive element.

3. A liquid injector according to claim 1, wherein the modulator is a circuit that generates the modulated signal by pulse width modulation of the error signal.

4. A liquid injector according to claim 1, wherein the modulator is a circuit that generates the modulated signal by pulse density modulation of the error signal.

5. A medical device comprising the liquid injector according to claim 1.

* * * * *